United States Patent [19]

Tarng

[11] 4,420,765
[45] Dec. 13, 1983

[54] MULTI-LAYER PASSIVANT SYSTEM

[75] Inventor: Ming L. Tarng, Mercerville, N.J.

[73] Assignee: RCA Corporation, New York, N.Y.

[21] Appl. No.: 268,284

[22] Filed: May 29, 1981

[51] Int. Cl.³ .......................................... H01L 29/34
[52] U.S. Cl. ...................................... 357/54; 357/52; 357/13
[58] Field of Search .................. 357/52, 54, 54 G, 13, 357/13 U

[56] References Cited

U.S. PATENT DOCUMENTS

| 4,014,037 | 3/1977 | Matsushita et al. | 357/52 |
| 4,063,275 | 12/1977 | Matsushita et al. | 357/54 |
| 4,081,292 | 3/1978 | Aoki et al. | 357/52 X |
| 4,084,986 | 4/1978 | Aoki et al. | 357/52 X |
| 4,174,252 | 11/1979 | Kressel et al. | 357/54 X |
| 4,194,934 | 3/1980 | Blaske et al. | 357/54 X |
| 4,344,985 | 8/1982 | Goodman et al. | 357/54 X |
| 4,375,125 | 3/1983 | Byatt | 357/52 X |

FOREIGN PATENT DOCUMENTS 1552759 9/1979 United Kingdom .
1552760 9/1979 United Kingdom .

Primary Examiner—Martin H. Edlow
Assistant Examiner—W. Mintel
Attorney, Agent, or Firm—Birgit E. Morris; Donald S. Cohen; Thomas H. Magee

[57] ABSTRACT

There is disclosed a semiconductor device having a PN junction terminating at a surface and passivated by a multi-layer passivant system comprising a first layer of semi-insulating material over the surface, a layer of dielectric material over the first layer and a second layer of semi-insulating material over the dielectric layer. Preferably, the first and second layers are oxygen doped polycrystalline silicon and the dielectric layer is either silicon dioxide of frit glass fused to the first layer.

10 Claims, 1 Drawing Figure

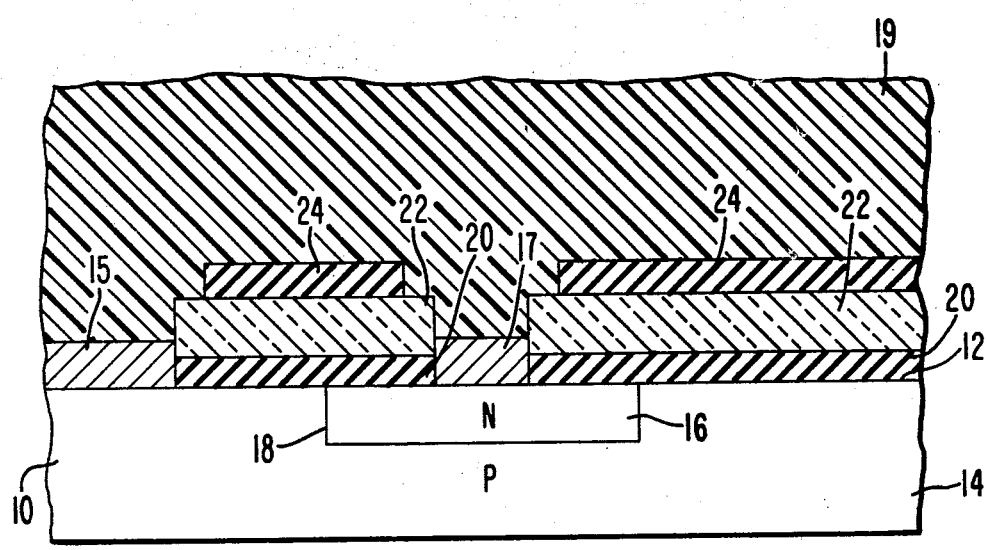

MULTI-LAYER PASSIVANT SYSTEM

BACKGROUND OF THE INVENTION

This invention relates to a passivant system for semiconductor junctions, and more particularly, to a multi-layer passivant system.

A recently utilized passivant system for high voltage semiconductor junctions includes a layer of semi-insulating material, most usually oxygen doped polycrystalline silicon, applied either directly on the semiconductor surface or over an oxide layer on such surface. Over this semi-insulating layer there is provided an oxide layer, usually silicon dioxide ($SiO_2$), over the oxide layer there is provided a relatively thick glass layer and over the glass layer there is provided yet another oxide layer.

With the above described systems, fringing fields can be developed from stray charge in the encapsulant material around the device and can cause a build up of charge at the interface between the semi-insulating material and the semiconductor surface. Such charge build up alters the depletion region when the device is reverse biased and can result in degradation of the breakdown voltage of the device or an increase in its leakage current. Moreover, these fringing fields may also cause the chemical degradation of the encapsulant material. In order to minimize the presence of stray charge and its adverse consequences, a high degree of cleanliness or special materials are used during the passivation, metallization, encapsulation and packaging processes used in making semiconductor devices. This results in a relatively high cost of manufacture.

In addition, fringing fields developed during reverse bias of the device extend from the semi-insulating materials into the encapsulant material around the device. These fields cause the migration of impurity ions in the encapsulant toward the dielectric and also attract external impurity ions to the encapsulant. If the encapsulant is a glass or resin material, it deteriorates and absorbs additional impurities and moisture which impurities ionize in the presence of the moisture. These additional impurity ions also migrate to the dielectric. Eventually, these ions induce a large current flow in the device which because of the high voltage during device operation generates heat which can cause catastrophic failure of the device.

SUMMARY OF THE INVENTION

This invention minimizes the degradation of the breakdown voltage of a semiconductor device, lessens its cost of manufacture and prevents the premature breakdown of the dielectric passivation material. This is accomplished by providing, on a semiconductor device having a PN junction with a surface intercept, a multi-layer passivant system comprising a first layer of semi-insulating material over the surface intercept, a layer of dielectric material over the first layer of semi-insulating material and a second layer of semi-insulating material over the dielectric layer.

BRIEF DESCRIPTION OF THE DRAWING

For a better understanding of the invention, reference is made to the following description of a preferred embodiment thereof taken in conjunction with the figure of the accompanying drawing which is a section view of a portion of a semiconductor device passivated by a multi-layer system in accordance with this invention.

DETAILED DESCRIPTION OF A PREFERRED EMBODIMENT

In the drawing there is illustrated a semiconductor device formed in a body 10 of silicon or any other suitable semiconductor material. The body 10 includes a surface 12 in which is formed a region 14 doped with atoms of one conductivity type and a region 16 doped with atoms of the opposite conductivity type. In the embodiment disclosed herein, the region 14 is doped with P type atoms and the region 16 is doped with N type atoms. The regions 14 and 16 form a PN junction 18 that terminates in or intercepts the surface 12. The regions 14 and 16 can be formed in accordance with conventional techniques, for example, by starting with a wafer doped with P type atoms, then forming the N region by diffusion. The regions 14 and 16 are contacted by ohmic contacts 15 and 17 deposited by conventional metallization techniques. When the device 10 is packaged, it is encapsulated in a suitable material 19 such as an epoxy resin, glass or other suitable low cost material.

To passivate the junction 18, a multi-layer passivant system is formed over the surface 12. Although a planar surface 12 is disclosed, it should be understood that the semiconductor device being fabricated could include mesas or moats where the junction 18 terminates. In these cases, the surface 12 would be inclined and the multi-layer passivant system would be deposited on these surfaces.

The multi-layer passivant system includes a first layer of semi-insulating material 20 deposited over the surface 12 and the junction 18, a dielectric layer 22 deposited over the semi-insulating layer 20 and a second layer of semi-insulating material 24 deposited over the dielectric layer 22. The first semi-insulating layer 20 can be applied directly on the surface 12 or on an oxide layer grown on that surface. Preferably the semi-insulating layers 20 and 24 are oxygen doped polycrystalline silicon and the dielectric layer 22 is either silicon dioxide ($SiO_2$) or a frit glass fused over the first semi-insulating layer. Other suitable materials can, of course, be used.

The resistivity of the first-semi-insulating layer 20 should be such that the junction leakage current through it is about equal to or less than the reverse bias junction leakage current and low enough to provide vertical field shielding and lateral field spreading capabilities. For most practical PN junctions the resistivity of the semi-insulating layer 20 should be from about $10^7$ ohm-cm to about $10^{10}$ ohm-cm. The breakdown strength of the layer 20 should be greater than that of the semiconductor material so that the layer 20 will not breakdown before the junction under reverse bias. The layer 20 can be of any suitable thickness depending on its conductivity, mechanical and thermal properties. A thickness of from about 1000 Angstroms to several microns is suitable with about 5000 Angstroms being preferred.

The dielectric layer 22 should be able to support about one-half of the reverse breakdown voltage of the junction 18 to avoid the possibility of premature dielectric breakdown at defect sites and to accommodate the decrease in the dielectric's breakdown field strength with increases in temperature. With the multi-layer passivant system in accordance with this invention, the second semi-insulating layer 24 terminates the fringing field extending from the first such layer 22. The field lines extend from the layer 20 at relatively shallow angles so that they extend farther in the lateral direction than in the vertical. This is because the semi-insulating layer 24 is nearly an equipotential surface, but the layer 20 is not. Because of the large lateral extent of the field lines, a dielectric capable of supporting about one-half the breakdown voltage of the junction 18 should be more than adequate. Once the dielectric material is chosen, the required thickness of the dielectric layer 22 can be calculated by the following:

$$t \approx BV_R/2E_b$$

where t is the thickness of the dielectric layer, $BV_R$ is the reverse breakdown voltage of the junction 18 and $E_b$ is the breakdown fieldstrength of the dielectric. Most commonly used dielectric materials have a breakdown field strength of about $10^6$ to about $10^7$ V/cm so that the thickness of the dielectric layer should vary, depending on the dielectric used, from about 1 micron to passivate a 1000 volt junction to about 15 microns to passivate a 3000 volt junction. For a 1000 volt junction, the dielectric 22 can be silicon dioxide having a thickness of about 1 micron; for a 3000 volt junction, the dielectric can be frit glass having a thickness of about 15 microns.

With respect to the second semi-insulating layer 24, its characteristics are generally determined by the same criteria explained with respect to the first such layer 20. Its resistivity, breakdown field strength and thickness are about the same as those of the first layer 20. While the second semi-insulating layer 24 can have a lower limit for its resistivity of less than $10^7$ ohm-cm, it is preferred to maintain its resistivity of at least about $10^7$ ohm-cm. In this way, should the dielectric layer 22 breakdown, the junction will not experience catastrophic failure.

While the second semi-insulating layer 24 must be electrically isolated from the first semi-insulating layer 20 and from the ohmic contacts 15 and 17, it can cover the entire surface of dielectric layer 22. It is only necessary that the second semi-insulating layer 24 cover the lateral extent of the surface depletion region when the junction 18 is biased at the reverse breakdown voltage. In practice, the outer edge of the second semi-insulating layer should terminate at least about 5 to 10 microns short of the outer edge of the dielectric layer 22 to assure that it does not inadvertently touch the ohmic contacts 15 and 17.

One method of forming an oxygen doped polycrystalline silicon layer 20 involves the use of a chemical vapor deposition (CVD) process carried out at about atmospheric pressure. With such a process, the wafer is placed in a CVD reactor and the temperature in the reactor is raised to a temperature within the range of about 450° C. to about 800° C. with a preferred temperature being about 670° C. At this elevated temperature, nitrous oxide (N₂O) and silane (SiH₄) are fed into the reactor chamber in a ratio determined by the desired resistivity of the layer 20. It has been found that a ratio of nitrous oxide to silane of about 0.2 to about 0.3 is preferred for most purposes. At the elevated temperature, the nitrous oxide and silane react on the hot surface of the wafer and form a layer of polycrystalline silicon uniformly doped with oxygen atoms. This reaction is maintained until a layer of the desired thickness is provided.

After depositing the layer 20, it is usually annealed, that is, heated to a temperature on the order of about 900° C. for about 30 minutes. This annealing step insures a reliable bond between the silicon and oxygen atoms and otherwise stabilizes the material.

If the dielectric layer 22 is frit glass, it can comprise, by weight, about 50% lead or zinc oxide, about 40% silicon dioxide and about 10% aluminum oxide. It can be applied in the form of a powder which is initially suspended in a binder medium such as alcohol, a chlorinated organic solvent, or photoresist to form a slurry. The slurry is applied over the outermost surface layer 20 by doctor-blading, or spinning, or the like. In the case of a photoresist-glass slurry, photolithographic techniques can be used to selectively deposit it. After the slurry is applied, the wafer is heated to evaporate or burn off the binder medium. In the case where the binder medium is alcohol the wafer is heated to a temperature of about 640° C. for a period of about 30 minutes in an ambient of air.

The wafer is then heated to a fusing temperature at which the slurry becomes fluid and flowable. For the glass composition described above, the wafer is heated to a temperature between from about 700° C. to about 1000° C. and is maintained at that temperature for about 10 to about 15 minutes. Upon cooling, the glass layer 22 forms a bond with the silicon of the layer 20.

If the dielectric layer 22 is silicon dioxide, it can be deposited by a conventional low temperature oxide growth technique by placing the wafer in a CVD reactor and heating it to a temperature of about 400° C. to about 600° C. Silane (SiH₄) and oxygen are then fed into the reactor and react to deposit silicon dioxide on the wafer. The oxide is then annealed to a temperature of about 900° C. in a nitrogen atmosphere. If the semi-insulating layer 20 is oxygen doped polycrystalline silicon, the silicon dioxide can be thermally grown while annealing the layer 20. This is accomplished by admitting steam mixed with about 1% to 10% hydrogen chloride (HCl) into the CVD reactor in which the layer 20 is annealed. These conditions are maintained for a period of time sufficient to convert some of the oxygen doped polycrystalline silicon to silicon dioxide.

The second semi-insulating layer 24 can be deposited in accordance with the same technique used to deposit the layer 20. After the boundaries of the three passivant layers are defined by conventional photolithographic means, the devices can be metallized to form ohmic contacts, separated from each other, encapsulated and packaged, all without the necessity for strict standards of cleanliness inasmuch as the second semi-insulating layer 24 protects the dielectric layer 22 from the external field from the ambient. In addition, it should be understood that the semi-insulating layer 24 protects the encapsulant 19 from the fringing field produced by the reverse bias of the junction 18. It should be obvious to those skilled in the art that various changes and modifications can be made without departing from the true spirit and scope of the invention as recited in the appended claims.

I claim:

1. A semiconductor device comprising a body of semiconductor material having at least two regions of opposite conductivity type forming a PN junction therebetween, said PN junction terminating in a surface of said body, a first layer of semi-insulating material over said surface and covering said PN junction, a layer of dielectric material over said first semi-insulating layer and a second layer of semi-insulating material over said dielectric layer.

2. A semiconductor device in accordance with claim 1 wherein said first and second layers of semi-insulating material comprise oxygen doped polycrystalline silicon.

3. A semiconductor device in accordance with claims 1 or 2 wherein said dielectric layer comprises a frit glass fused over said first semi-insulating layer.

4. A semiconductor device in accordance with claim 1 wherein said second semi-insulating layer extends across the surface depletion region of said junction when said junction is biased at its reverse breakdown voltage.

5. A semiconductor device in accordance with claim 4 wherein the outer edge of said second semi-insulating layer is spaced inwardly from the outer edge of said dielectric layer.

6. A semiconductor device in accordance with claim 1 wherein the resistivity of said first semi-insulating layer is such that the junction leakage current through it is about equal to or less than the reverse bias junction leakage current.

7. A semiconductor device in accordance with claim 1 wherein the resistivity of said first and second semi-insulating layers is from about $10^7$ ohm-cm to about $10^{10}$ ohm-cm.

8. A semiconductor device in accordance with claims 1 or 2 wherein the breakdown field strength of the first and second semi-insulating layers is such that it will not breakdown before said junction under reverse bias.

9. A semiconductor device in accordance with claim 1 wherein said dielectric layer is of a material and thickness to support about one-half the breakdown voltage of said junction.

10. A semiconductor device in accordance with claims 1 or 2 wherein said dielectric layer comprises silicon dioxide.

* * * * *